United States Patent
Snyder et al.

(10) Patent No.: US 7,821,075 B2
(45) Date of Patent: Oct. 26, 2010

(54) CMOS DEVICE WITH ZERO SOFT ERROR RATE

(75) Inventors: John P. Snyder, Edina, MN (US); John M. Larson, Northfield, MN (US)

(73) Assignee: Avolare 2, LLC, Chapel Hill, NC (US)

(*) Notice: Subject to any disclaimer, the term of this patent is extended or adjusted under 35 U.S.C. 154(b) by 203 days.

(21) Appl. No.: 11/546,829

(22) Filed: Oct. 12, 2006

(65) Prior Publication Data

US 2007/0080406 A1 Apr. 12, 2007

Related U.S. Application Data

(60) Provisional application No. 60/726,042, filed on Oct. 12, 2005.

(51) Int. Cl.
*H01L 27/095* (2006.01)
*H01L 27/092* (2006.01)
*H01L 21/8238* (2006.01)

(52) U.S. Cl. .............. 257/371; 257/327; 257/369; 257/471; 257/E27.068

(58) Field of Classification Search .......... 257/369, 257/371, 372, 373, 374, 288, 327, 351, 368, 257/370, 382, 471, 486, E27.068
See application file for complete search history.

(56) References Cited

U.S. PATENT DOCUMENTS

| | | | |
|---|---|---|---|
| 4,864,382 A * | 9/1989 | Aoki et al. ............. | 257/297 |
| 5,124,770 A * | 6/1992 | Umemoto et al. ......... | 257/192 |
| 6,255,704 B1 | 7/2001 | Iwata et al. | |
| 6,271,105 B1 * | 8/2001 | Kwon et al. ............. | 438/524 |
| 6,303,479 B1 | 10/2001 | Snyder | |
| 6,420,763 B1 | 7/2002 | Yamashita et al. | |
| 7,230,303 B1 * | 6/2007 | Liao ...................... | 257/369 |
| 7,521,765 B2 * | 4/2009 | Tsutsumi et al. ......... | 257/392 |
| 2003/0235936 A1 * | 12/2003 | Snyder et al. ............ | 438/92 |
| 2004/0041226 A1 * | 3/2004 | Snyder et al. ............ | 257/471 |
| 2005/0062071 A1 | 3/2005 | Matsuzawa et al. | |

(Continued)

OTHER PUBLICATIONS

J. Kedzierski et al., "Complementary silicide source/drain thin body MOSFETs for the 20 mm gate length regime", *IEDM*, 2000, pp. 57-60.

(Continued)

*Primary Examiner*—Kiesha R Bryant
*Assistant Examiner*—Eric Ward
(74) *Attorney, Agent, or Firm*—David J. King; Charles A. Lemaire; Lemaire Patent Law Firm, P.L.L.C.

(57) ABSTRACT

A CMOS device and method of manufacture is provided for producing an integrated circuit that is not susceptible to various soft errors such as single-event upsets, multi-bit upsets or single-event latchup. The CMOS device and method utilizes a new and novel well architecture in conjunction with metal source/drain electrodes to eliminate soft errors. In one embodiment, the CMOS device uses a first metal source/drain material for the NMOS device and a second metal source/drain material for the PMOS device. The CMOS device further uses a multi-layered well-structure with a shallow N-well and a buried P-well for the PMOS device and a shallow P-well and a buried N-well for the NMOS device.

20 Claims, 6 Drawing Sheets

U.S. PATENT DOCUMENTS

2005/0079668 A1\* 4/2005 Jung .......................... 438/232
2006/0125040 A1\* 6/2006 Levin et al. ................. 257/471

OTHER PUBLICATIONS

E. DuBois et al., Low Schottky barrier source/drain for advanced MOS architecture: device design and maSolid State Electronics, 2002, pp. 997-1004.

J. Guo et al., IEEE Transaction on Electronic Devices, 2002, pp. 1897-1902.

K. Ikeda et al., IEEE Electronic Device Letters, 2002, pp. 670-672.

M. Tao et al., Applied Physics Letters, 2003, pp. 2593-2595.

Ng, Wai Tung and Salama, Andre T., "A CMOS-Compatible Complementary SINFET HVIC Process", *IEEE Transactions on Electronic Devices*, vol. 38, Aug. 1991, No. 8, pp. 1935-1942.

Kenichi, Osada, et al., "Analysis of SRAM Neutron-Induced Errors Based on Consideration of Both Charge-Collection and Parasitic-Bipolar Failure Modes", IEEE 2004 Custom Integrated Circuits Conference, p. 357.

C. M. Hsieh, et al., "A Field-funneling Effect on the Collection of Alpha-Particle-Generated Carriers in Silicon Devices", IEEE Electron Device Letters, V. 2, No. 4, p. 103, 1981.

"A CMOS-Compatabile Complementary SINFET HVIC Process", by Wai Tung Ng and C. Andre T. Salama, *IEEE Transactions on Electron Devices*, vol. 38, Aug. 1991, No. 8, pp. 1935-1942.

Gasiot et al., "Multiple Cell Upsets as the Key Contribution to the Total SER of 65 nm CMOS SRAMs and Its Dependence on Well Engineering", IEEE Transaction on Nuclear Science, Dec. 2007, pp. 2468-2473, vol. 54, No. 6.

Hutson et al., "The Effects of Scaling and Well and Substrate Contact Placement on Single Event Latchup in Bulk CMOS Technology", "RADECS 2005 Proceedings", 2005, pp. PC24.1-PC24.5.

Narasimham et al., "Effects of Guard Bands and Well Contracts in Mitigating Long SETs in Advanced CMOS Process", "IEEE Transactions on Nuclear Science", Jun. 2008, pp. 1708-1713, vol. 55, No. 3.

Olson et al., "Analysis of Parasitic PNP Bipolar Transistor Mitigation Using Well Contacts in 130 nm and 90 nm CMOS Technology", "IEEE Transactions on Nuclear Science", Aug. 2007, pp. 894-897, vol. 54, No. 4.

Puchner et al., "Alpha-Particle SEU Performance of SRAM With Triple Well", "IEEE Transactions on Nuclear Science", Dec. 2004, pp. 35253528, vol. 51, No. 6.

Seifert et al., "Multi-Cell Upset Probabilities of 45 nm High-k + Metal Gate SRAM Devices in Terrestrial and Space Enviroments", "IEEE 46th Annual International Reliability Physics Symposium, Phoenix, 2008", 2008, pp. 181-186.

\* cited by examiner

US 7,821,075 B2

CMOS DEVICE WITH ZERO SOFT ERROR RATE

CROSS-REFERENCE TO RELATED APPLICATION

This application claims the benefit of and priority to U.S. provisional patent application Ser. No. 60/726,042, filed Oct. 12, 2005.

FIELD OF THE INVENTION

The present invention generally relates to the field of semiconductor systems and manufacturing processes. More particularly, the present invention relates to semiconductor integrated circuits (ICs) having transistors for regulating the flow of electric current having metal sources and/or drains forming Schottky or Schottky-like contacts to a channel region, and the manufacturing processes thereof.

BACKGROUND OF THE INVENTION

One type of integrated circuit reliability problem known in the art is soft errors (James F. Ziegler, "SER—History, Trends and Challenges. A Guide for Designing with Memory ICs"). Soft errors occur when digital information spontaneously changes due to radiation effects. Soft errors do not permanently damage hardware but rather corrupt electronically stored information, which can lead to circuit failure. Other terms typically used to describe this reliability problem are "Single-Event Upset" (SEU) and "Single-Event Effects" (SEE). The rate at which soft errors occur is known as the soft error rate (SER).

The radiation that causes soft errors to occur has three primary sources: (1) thermal neutrons; (2) alpha particles generated from contaminants in CMOS processing or packaging; and (3) high-energy neutrons. High energy neutrons tend to be the most problematic radiation source as they are difficult to absorb by packaging techniques, and following a nuclear reaction between the incident neutron and a silicon atom in the substrate, secondary ions are produced that generate approximately ten times as much free charge compared to the charge generated from an alpha particle strike (Kenichi Osada et al., "Analysis of SRAM Neutron-Induced Errors Based on the Consideration of Both Charge-Collection and Parasitic-Bipolar Failure Modes," IEEE 2004 Custom Integrated Circuits Conference, p. 357).

FIG. 1 illustrates a conventional CMOS structure 100 comprising an NMOS device 101 and a PMOS device 102. The device may be part of a larger cell or integrated circuit such as a 6-T SRAM cell that comprises two cross-coupled CMOS devices, and which is particularly susceptible to soft errors. The NMOS/PMOS devices 101/102 have a gate electrode 105/106 on a gate insulator layer 109, a source electrode 110/111 and a drain electrode 115/116. The gate electrodes 105/106 have a protective sidewall spacer insulator 151. For the illustrative CMOS device of FIG. 1, the source electrode 110 of the NMOS device 101 is connected to ground (GND) 180. The source electrode 111 of the PMOS device 102 is connected to the power supply $V_{dd}$ 175. The gate electrodes 105,106 are connected to the input voltage $V_i$ 182, which is GND. The drain electrodes 115,116 are connected to the output voltage $V_o$ 185, which is at $V_{dd}$, by means of the PMOS device 102 being in the on-state. The NMOS device 101 is in the off-state, which is a state generally susceptible to soft errors.

P-well 120 doping is provided to isolate the NMOS device 101 from other PMOS devices, while N-well 121 doping is provided to isolate the PMOS device 102 from other NMOS devices. The channel doping regions 126,127 are commonly provided by halo or pocket implants. A field oxide 190 electrically isolates devices from one another, the field oxide for example being an STI field oxide. A depletion layer 130 is formed at the p-n diode junction 140 of the drain electrode 115 with the P-well 120. The width of the depletion layer 130 is a function of the drain bias and the doping in the substrate.

For the sake of illustrating the important physics and mechanisms that lead to soft errors, the NMOS device 101 is discussed. Referencing FIG. 1, a high energy alpha particle 150 is shown striking through the drain electrode 115, through the drain depletion layers 130, then through the P-well 120 and further into the semiconductor substrate 145. Along the path of the striking alpha particle 150, electron and hole pairs 155 are created, thereby generating free charge along the strike path 160. The carriers located within a high electric field region such as in the drain depletion region 130 of the drain-substrate p-n diode junction are quickly collected (electrons) or repelled into the substrate (holes). Charge neutrality prevails at the instant the free charge is generated during the strike event. However, as the electrons and holes in the depletion layer 130 distribute themselves relatively quickly vis-à-vis a drift mechanism, charge neutrality does not prevail and the semiconductor bands bend, resulting in a perturbed potential profile 161 in the vicinity of the strike path 160. The potential perturbation progresses along the particle strike path 160 as more and more of the free charge is either swept or funneled towards the drain 115 (electrons) or into the semiconductor substrate 145 (holes) via this rapid drift mechanism. After tens of nanoseconds, the charge sufficiently redistributes so that the carrier density becomes comparable to the substrate doping and the disturbed field along the particle track relaxes to its original state. This highly transient field disruption immediately after the particle strike is commonly referred to as the field-funneling effect (C. M. Hsieh, et al., "A Field-funneling Effect on the Collection of Alpha-Particle-Generated Carriers in Silicon Devices", IEEE Electron Device Letters, V. 2, no. 4, p. 103, 1981). If the amount of charge collected at the drain 115 during the field-funneling process is larger than a critical charge ($Q_{crit}$), the drain 115 voltage can permanently be lowered and a soft error occurs. In the context of a 6-T SRAM cell, this would lead to a "flipped bit" or single-event upset (SEU) of the cell state.

The holes that drift away from the drain 115 due to the field-funnel effect and the balance of the free charge from the particle strike outside of the funnel region proceed to be transported through a diffusion mechanism. In particular, the P-well 120 floats to a positive bias due to the excess hole charge, which, if sufficiently high, activates parasitic bipolar action at the source 110 and potentially between the NMOS device 101 and neighboring devices. In particular, charge amplification occurs at the source 110 while collecting the hole carriers due to significant back injection of electrons caused by parasitic bipolar effect (Osada). The back-injected electrons traverse the channel and are collected at the drain 115, further adding to the drain collected charge and may tip the drain 115 past $Q_{crit}$, thereby causing a soft-error, when otherwise an error may not have occurred. Furthermore, the floating P-well 120 activates a parasitic bipolar device between the P-well 120 and the neighboring cell (not shown), which leads to a flow of back-injected electrons from the neighboring cell source to the neighboring cell drain, and therefore a lowering of the voltage on the neighboring cell drain and ultimately a soft error. As a result, multiple bits can flip from a single particle strike, an effect known as "Multi-bit upsets" (MBU) or "Multi-cell errors" (MCE).

Latch-up is unique problem for CMOS circuits and is caused by the presence of lateral bipolar NPN and PNP transistors. These unwanted parasitic bipolar transistors can act as amplifiers, causing the circuit to fail by shorting power to ground. To solve this problem, a conventional CMOS layout typically includes N-type and P-type well implants for the PMOS and NMOS devices respectively. The N-type and P-type well implants are electrically contacted via ohmic contacts to $V_{dd}$ and ground power supplies respectively. Referencing FIG. 1 as an example, an N-well 121 is doped with the opposite polarity of that of the semiconductor substrate 145. The well fabrication procedure depends on the requirements for latch-up immunity, and other factors such as packing density and independent threshold voltage adjustment. A heavily doped N-type ohmic contact 170 is provided in direct contact with the N-well 121, and is electrically connected to the supply voltage $V_{dd}$ 175, while the substrate 145 is typically grounded. A related soft error mechanism is "single-event latchup" (SEL), which occurs when latchup is triggered by anomalous charge generated during a particle strike, such as the particle strike 150 illustrated in FIG. 1.

In summary, there are a variety of failure mechanisms that lead to soft errors including for example SEU, MBU, and SEL. In these cases, the failure is generally traceable to one of two mechanisms: the field-funneling effect or parasitic bipolar action activated by well charging. The problem has historically been mitigated but generally not completely eliminated by several means including for example modifying the manufacturing process, altering the CMOS device architecture, adding error correction code to the integrated circuit, adding protective packaging layers and shielding to block radiation, or optimizing the system design. However, these approaches generally do not guarantee elimination of the soft error problem and are used at the expense of added cost, size, weight, and generally decreased speed performance and increased power consumption. Furthermore, as semiconductor technology continues to scale to higher density integration, lower storage node capacitances and reduced voltages, integrated circuits become increasingly sensitive to the radiation effects that cause soft errors. As a result, the problem of soft errors will become an increasingly problematic reliability challenge for integrated circuit manufacturers in the future.

There is a need in the art for a CMOS integrated circuit technology that eliminates soft errors without added cost and performance degradation.

BRIEF SUMMARY OF THE INVENTION

In one aspect, the present invention provides a CMOS structure comprising a first metal source/drain material for an NMOS device, and a second metal source/drain material for a PMOS device. The PMOS and NMOS devices have a multi-layered well structure with a shallow N-well on a buried P-well and a shallow P-well on a buried N-well for the PMOS and NMOS devices, respectively. The resulting CMOS circuit provides zero soft error rate.

In another aspect, the present invention provides a method of fabricating an integrated circuit having zero soft error rate. The present invention, in one embodiment, provides for a CMOS circuit having an N-type well (N-well) implant in an NMOS active region and a P-type well (P-well) implant in the NMOS active region, the first N-well located vertically below the P-well. It further includes providing a second N-well implant in a PMOS active region. The method further includes providing a gate insulator layer. The method further includes providing a first gate electrode for the NMOS device and a second gate electrode for the PMOS device on the gate insulator layer. The method further includes providing a sidewall spacer insulator layer on the first and second gate electrodes. The method further includes exposing the substrate in areas proximal to the gate electrode. The method further includes using a dual silicide exclusion mask process to provide a first Schottky or Schottky-like source/drain region for the PMOS device and then a second Schottky or Schottky-like source/drain region for the NMOS device. The method further includes providing electrical connection between the PMOS and NMOS devices, thereby forming a CMOS circuit device.

While multiple embodiments are disclosed, still other embodiments of the present invention will become apparent to those skilled in the art from the following detailed description, which shows and describes illustrative embodiments of the invention. As will be realized, the invention is capable of modifications in various obvious aspects, all without departing from the spirit and scope of the present invention. Accordingly, the drawings and detailed description are to be regarded as illustrative in nature and not restrictive.

DETAILED DESCRIPTION

Figure 1:
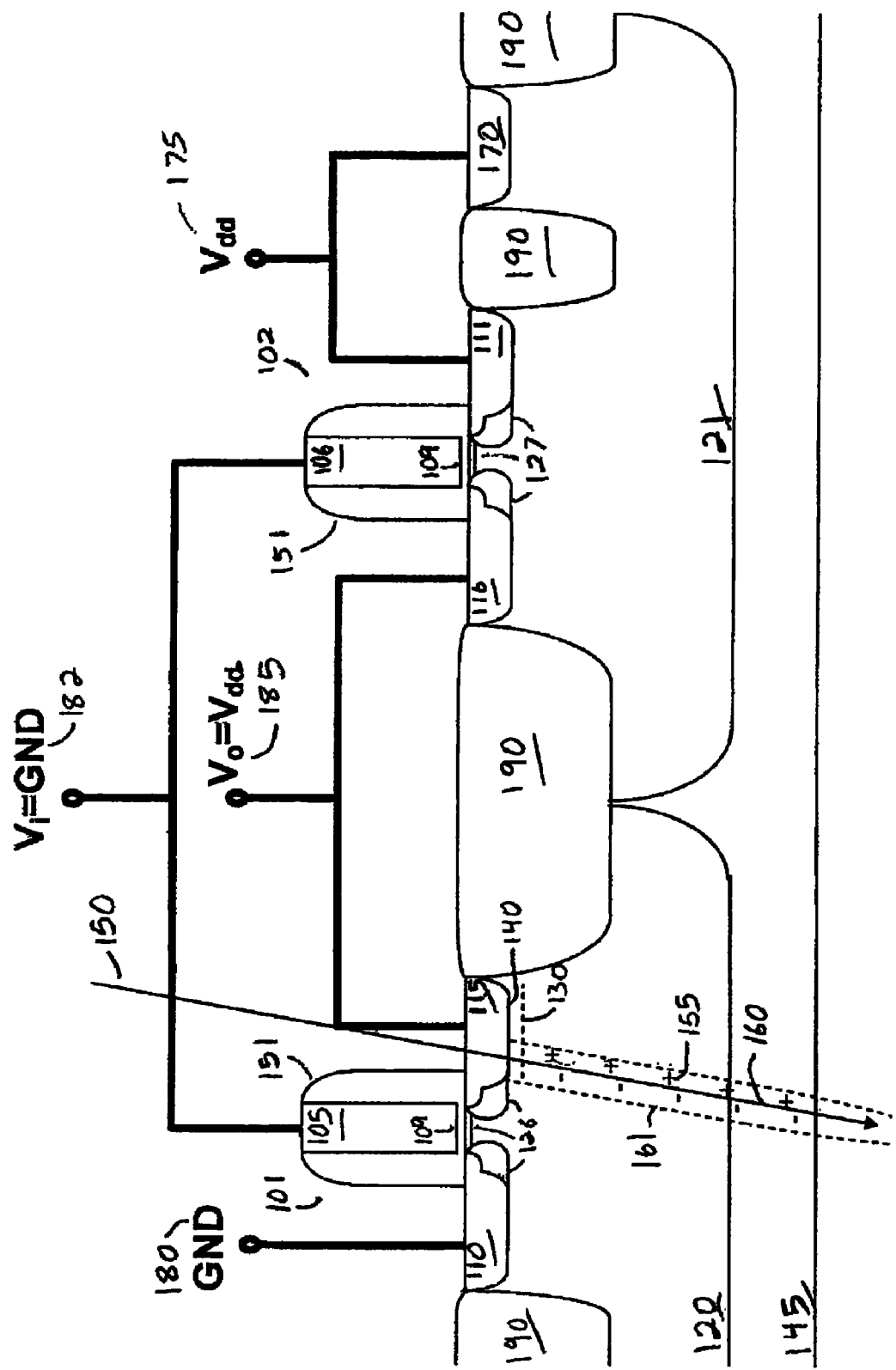
FIG. 1 illustrates a cross-sectional view of a conventional CMOS structure susceptible to soft errors.

In general, the present invention provides an integrated circuit and method of fabrication, the circuit having zero soft error rate. In one embodiment of the present invention, the integrated circuit is generally comprised of at least one NMOS device or at least one PMOS device; wherein at least one of the NMOS devices or PMOS devices is a Schottky barrier MOS (SB-MOS) device with no parasitic bipolar action and significantly reduced field-funneling effect during an energetic particle strike by means of a buried well structure. The present invention also provides a method comprising the steps of providing a semiconductor substrate; providing isolation regions, such as STI, that separate NMOS active regions and PMOS active regions; providing an N-type well (N-well) implant in the NMOS active region and a P-type well (P-well) implant in the NMOS active region, the first N-well located vertically below the P-well region; providing a second N-well implant in the PMOS active region, the first and second N-well implants and the P-well implants are not electrically contacted to an ohmic contact; providing a first electrically insulating layer in contact with the semiconductor substrate; providing a first gate electrode on the first electrically insulating layer in the NMOS active region; providing a second gate electrode on the first insulator layer in the PMOS active region; providing a second electrically insulating layer around the first and second gate electrodes including gate electrode sidewalls, and exposing the substrate on one or more areas proximal to the gate electrodes. A first silicide exclusion mask is then used to prevent formation of silicide in the NMOS active region while exposing the PMOS active region. A first Schottky or Schottky-like contact is formed by reacting a first thin metal layer with the exposed semiconductor substrate in the PMOS active region, then removing any unreacted metal, thereby forming source and drain electrodes of the PMOS device at least in areas proximal to the second gate electrode. A second silicide exclusion mask is then used to prevent formation of silicide in the PMOS active region while exposing the NMOS active region. A second Schottky or Schottky-like contact is formed by reacting a second thin metal layer with the exposed semiconductor substrate in the NMOS active region, then removing any unreacted metal, thereby forming source and drain electrodes of a NMOS device at least in areas proximal to the first gate electrode. The PMOS and NMOS devices are then electrically connected by means known in the art.

One of the advantages of the present invention is that it eliminates parasitic bipolar action and dramatically reduces the field-funneling effect. As a result, a CMOS device in accordance with the principles of the present invention is unconditionally immune to latch-up, snapback effects, single-event latchup (SEL), single-event upset (SEU), and multi-bit upsets (MBU), thereby having zero soft error rate.

Figure 2:
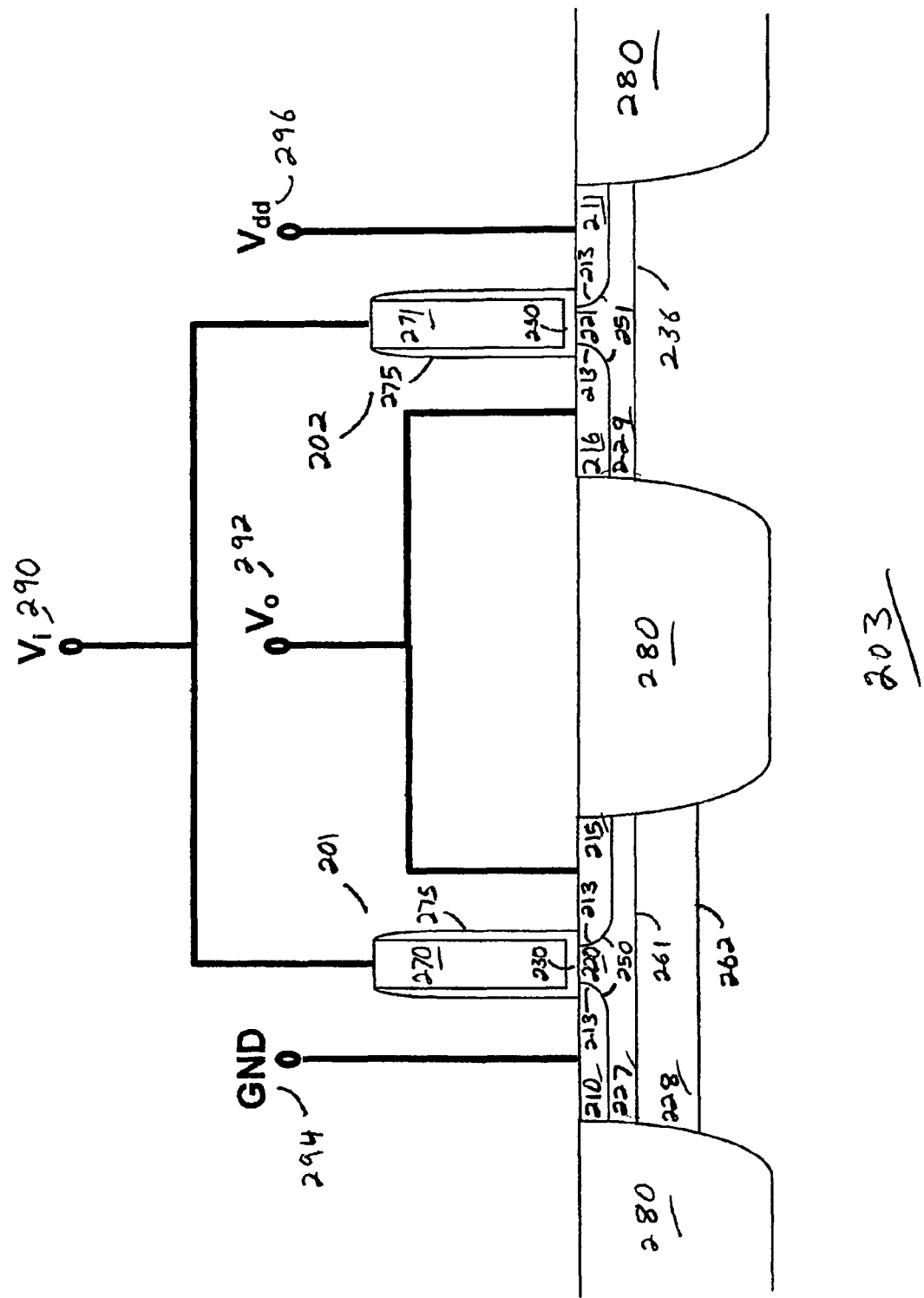
FIG. 2 illustrates a sectional view of an exemplary embodiment of a Schottky barrier CMOS device, in accordance with the principles of the present invention.

FIG. 2 shows a cross-sectional view of an exemplary embodiment of a Schottky barrier CMOS circuit device (SB-CMOS) 200 in accordance with the principles of the present invention. The SB-CMOS 200 includes a Schottky barrier NMOS (SB-NMOS) device 201 and a Schottky barrier PMOS (SB-PMOS) device 202, on a P-type semiconductor substrate 203, the SB-NMOS device 201 and SB-PMOS device 202 being electrically connected. A field oxide 280 electrically isolates devices from one another, the field oxide 280 for example being a Shallow Trench Isolation (STI) field oxide. One skilled in the art will readily realize that an SB-CMOS circuit can be comprised of many combinations of SB-MOS devices and conventional MOS devices. One such example would include an SB-CMOS circuit comprised of an SB-NMOS device and a conventional PMOS device on a semiconductor substrate, the SB-NMOS and conventional PMOS devices being electrically connected. The present invention is particularly suitable for use and fabrication of CMOS integrated circuits, but the use of the present teachings is not limited to this particular application. Other circuits comprising complimentary or non-complimentary NMOS and/or PMOS transistors may apply the present invention teachings. Thus, the term "CMOS circuit" should be interpreted broadly to include any appropriate circuit that comprises connected NMOS and/or connected PMOS, and/or connected NMOS and PMOS devices, and the like.

One skilled in the art will readily realize that the present invention is not limited in scope to a particular CMOS application or circuit type such as digital logic circuits including inverters, NAND gates, NOR gates, compound gates, multiplexers, and SRAM, DRAM, non-volatile memory, and the like. Furthermore, the present invention is not limited to digital or analog CMOS applications. These and all other circuit types that use combinations of NMOS and/or PMOS transistors are within the scope of the teaching of the present invention.

Throughout the discussion herein, there will be examples provided that make reference to a semiconductor substrate on which an SB-CMOS circuit device is formed. The present invention does not restrict the semiconductor substrate to any particular type. One skilled in the art will readily realize that many semiconductor substrates may be used for SB-CMOS circuits including, for example, silicon, silicon germanium, gallium arsenide, indium phosphide, strained semiconductor substrates, silicon-on-nothing (SON), and silicon-on-insulator (SOI). The strained semiconductor substrate may be strained as a whole, or may be strained locally at a SB-CMOS circuit device. Different types of process-induced local strain may be provided depending on the type of devices. For example, types of strain include biaxial, strained silicon directly on insulator, and uniaxial strain. These semiconductor substrate and any other semiconductor substrate or substrate technologies may be used within the scope of the teachings of the present invention.

Still in FIG. 2, the SB-NMOS and SB-PMOS devices 201,202 comprise source electrodes 210,211 and drain electrodes 215,216, separated by a channel region 220,221, respectively, having channel dopants (not shown). An electrically insulating layer 230 is disposed on top of the channel regions 220,221. The channel regions 220,221 are on-state current-carrying regions of the substrate 203, wherein mobile charge carriers such as holes and electrons flow from the sources 210,211 to the drains 215, 216. A device, such as the SB-NMOS device 201 or SB-PMOS device 202, is in the on-state when the channel regions between the source 210, 211 and drain 215,216 are highly conductive.

Referring again to FIG. 2, the sources 210,211 or the drains 215,216 (or both) are composed partially or fully of a metal. Because the sources 210,211 and/or the drains 215,216 are substantially composed of a metal or metals, they form Schottky or Schottky-like contacts 250,251 with the semiconductor substrate 203 and the channel region 220,221. For the purposes of clearly distinguishing the semiconductor regions, a semiconductor region located above the bottom of the sources 210,211 and the drains 215,216 to the insulator layer 230 is the channel region 220, 221, and a semiconductor region in contact with the bottom of the sources 210,211 and the drains 215,216 and below is the semiconductor substrate 203. It is anticipated that within the semiconductor substrate 203 and the channel regions 220,221, the type and concentration of doping may vary.

A Schottky contact is formed at an interface between a metal and a semiconductor, and a Schottky-like contact is formed by the close proximity of a metal and a semiconductor, wherein for example, the metal and the semiconductor are separated by approximately 0.1 to 10 nm. The Schottky contacts or Schottky-like contacts or junctions 250,251 may be provided by forming the sources 210,211 and/or the drains 215,216 from metal silicides. The sources 210,211 and the drains 215,216 may also be composed of layered stacks of metals, wherein a first metal is provided and additional metals may be used to cap or cover a top surface of a first metal. The Schottky or Schottky-like barriers 250,251 that exist along the interface of the corresponding metal source/drain 210, 211/215,216 and the channel region 220,221 and/or the semiconductor substrate 203 inherently act to confine the charge carriers and help control off-state leakage current.

Throughout the discussion herein, there will be examples provided that make reference to Schottky and Schottky-like barriers and contacts in regards to IC fabrication. The present invention does not recognize any limitations in regards to what types of Schottky interfaces may be used in affecting the teachings of the present invention. Thus, the present invention specifically anticipates these types of contacts to be created with any form of conductive material or alloy. For example, for the SB-PMOS device 202, the source 211 and drain 216 may be formed from any one or a combination of Platinum Silicide, Palladium Silicide, or Iridium Silicide. For the SB-NMOS device 201, the source 210 and drain 215 may be formed from a material from the group comprising Rare Earth Silicides such as Erbium Silicide, Dysprosium Silicide or Ytterbium Silicide, or combinations thereof. It is appreciated that any other suitable metals commonly used at the transistor level, such as titanium, cobalt and the like, can be used as well as a plethora of more exotic metals, and other alloys can be used to form the metal source/drain regions 210,211,215,216.

Additionally, while traditional Schottky contacts are abrupt, the present invention specifically anticipates that in some circumstances an interfacial layer may be utilized between the metal source/drain 210,211/215,216 and the semiconductor substrate 203 and/or the channel region 220, 221. These interfacial layers may be ultra-thin, having a thickness of approximately 10 nm or less. Thus, the present invention specifically anticipates Schottky-like contacts and their equivalents to be useful in implementing the present invention. Furthermore, the interfacial layer may comprise materials that have conductive, semi-conductive, and/or insulator-like properties. For example, ultra-thin interfacial layers of oxide or nitride insulators may be used, or ultra-thin dopant layers formed by dopant segregation techniques may be used, or ultra-thin interfacial layers of a semiconductor such as Germanium may be used to form Schottky-like contacts, among others.

The insulating layer 230 is comprised of a dielectric material such as silicon dioxide with a thickness of approximately 5 to 50 Å. In another embodiment, a material having a high dielectric constant (high K) is used as the insulating layer 230. Examples of high K materials are those materials having dielectric constants greater than that of silicon dioxide, including for example nitrided silicon dioxide, silicon nitride, and metal oxides such as $TiO_2$, $Al_2O_3$, $La_2O_3$, $HfO_2$, $ZrO_2$, $CeO_2$, $Ta_2O_5$, $WO_3$, $Y_2O_3$, and $LaAlO_3$, and the like second gate electrodes 270, 271 are positioned on top of the insulating layer 230, and a thin insulating layer sidewall spacer 275 surrounds the gate electrodes 270,271. The gate electrodes 270,271 may be doped with polysilicon, where Boron and Phosphorous dopants are used for the SB-PMOS gate electrode 271 and the SB-NMOS gate electrode 270 respectively. The gate electrodes 270,271 may also be composed entirely or in part of one or more metals. The gate electrodes 270,271 may be comprised of the same metals or different metals. The interface 213 of the source 210,211 and drain 215,216 electrodes to the channel region 220,221 is located laterally below the spacer 275 and partially below the gate electrodes 270, 271. In another embodiment, the interface 213 of the source 210,211 and drain 215,216 electrodes to the channel region 220,221 may be aligned with the edge of the sides of the gate electrodes 270, 271. In yet another embodiment, a gap may be formed between the interface 213 of the source 210,211 and drain 215,216 electrodes to the channel region 220,221 and the edge of the sides of the gate electrodes 270,271.

Referring to FIG. 2, the channel length is the distance from the source 210,211 to the drain 215,216 electrodes, laterally across the channel region 220,221, just below the insulator layer 230. The present invention is particularly suitable for use in situations where short channel length MOSFETs are to be fabricated, especially in the range of channel lengths less than 100 nm. However, nothing in the teachings of the present invention limits application of the teachings of the present invention to these short channel length devices. Advantageous use of the teachings of the present invention may be had with channel lengths of any dimension.

Channel dopants are provided in the channel regions 220, 221. Boron or Indium (P-type) and Arsenic (N-type) may be used for the SB-NMOS and SB-PMOS channel dopants, respectively. However, it is appreciated that any other suitable channel dopant species commonly used for PMOS or NMOS devices can be used in accordance with the principles of the present invention. Throughout the discussion herein there will be examples provided that utilize various dopant technologies in regards to MOSFET device fabrication. These dopants are only illustrative of a specific embodiment of the present invention and should not be interpreted to be limitive of the scope of teachings within the current invention. Note, however, that the present invention specifically anticipates the use of impurity atoms that are selected from the group consisting of Arsenic, Phosphorous, Antimony, Boron, Indium, and/or Gallium as being within the scope of the teachings of the present invention.

The channel dopant concentration profile typically has a maximum concentration, which is below the source 210,211 and drain 215,216 electrodes, and thus outside of the channel regions 220,221. For the purpose of the present invention, channel dopants are not constrained to be provided exclusively within the channel regions 220,221, but may be found in regions substantially outside of the channel region 220,221 and may have any dopant concentration and concentration profile. In another exemplary embodiment, a retrograde channel implant is used having a peak implant concentration of approximately $1 \times 10^{17}$ $cm^{-3}$ to $1 \times 10^{20}$ $cm^{-3}$ at a depth of approximately 5 nm to 100 nm in the semiconductor substrate 203 and having a concentration of approximately $1 \times 10^{15}$ $cm^{-3}$ to $1 \times 10^{19}$ $cm^{-3}$ at the gate insulator interface 230 to the channel region 220,221. The channel doping profile in channel regions 220 and 221 may be the same or may be different. Throughout the discussion herein, there will be examples provided that make reference to doping profiles in the channel region 220,221 and in the semiconductor substrate 203 below the channel region 220,221. The present invention does not restrict the type of channel doping and substrate doping profiles that may be used in affecting the teaching of the present invention. One skilled in the art will readily realize that many doping profiles may be used, including for example laterally and vertically non-uniform channel/substrate implants; laterally uniform and vertically non-uniform channel/substrate implants; laterally and vertically uniform channel/substrate implants. These and any combination of these doping profiles and any other channel/substrate doping profile including no doping are within the scope of the teachings of the present invention.

Additional doping is used to form the well regions of the SB-NMOS 201 and SB-PMOS 202 devices. In the present embodiment, the NMOS device 201 includes P-well doping 227 that is relatively shallow and that is not electrically contacted to an ohmic contact. The NMOS device 201 further includes a buried N-type layer 228 that is located below the P-well doping 227 and that is not electrically contacted to an ohmic contact. The buried N-type layer 228 is a layer of N-type doping located between the P-well doping 227 and the P-type semiconductor substrate 203. A metallurgical junction 261 is disposed between P-type doping and N-type doping wherein the P-type and N-type doping concentrations are equivalent. The metallurgical junction 261 between the P-well doping 227 and the buried N-type layer 228 is located approximately 50 nm to 1000 nm below the bottom of the NMOS source 210 and drain 215 electrodes. A bottom metallurgical junction 262 between the buried N-type layer doping 228 and the P-type substrate 203 is disposed above a bottom interface of the field oxide 280. Further in this embodiment, the SB-PMOS device 202 includes N-well doping 229 that is relatively shallow. A metallurgical junction 236 between the PMOS device N-well doping 229 and the P-type substrate 203 is disposed approximately 50 nm to 1000 nm below the bottom of the PMOS source 211 and drain 216 electrodes. In one embodiment of the present invention, the P-well doping 227 and buried N-type layer doping 228 of the NMOS device 201 are not ohmically contacted and are allowed to electrically float, while the N-well doping 229 of the PMOS device 202 is not ohmically contacted and is allowed to electrically float.

An ohmic contact is a low resistivity electrical contact to a semiconductor substrate. For example, impurity-doped ohmic contacts comprise an N-type heavily doped region in contact with an N-type doped semiconductor substrate or a P-type heavily doped region in contact with a P-type doped semiconductor substrate. Additionally, for example, metal ohmic contacts to semiconductor substrate comprise Erbium silicide in contact with an N-type doped semiconductor substrate or Platinum silicide in contact with a P-type doped semiconductor substrate.

Throughout the discussion herein there will be examples provided that make reference to well implants in regards to IC fabrication. Typically, conventional well implants are electrically contacted via ohmic contacts to power supplies such as $V_{dd}$ and ground for PMOS and NMOS transistors, respectively. The present invention does not restrict the type of electrical contact to the well implants, thereby allowing well implants that may be or may not be electrically contacted to a power supply, such as $V_{dd}$ or ground via ohmic contacts. The well implants described in the present invention are generally characterized as "not electrically contacted to an ohmic contact." However it is anticipated that other embodiments will be useful in which one or more of the well implants are electrically contacted to an ohmic contact. The phrase "electrically contacted to an ohmic contact" implies ohmic contacting to a power supply such as $V_{dd}$ or ground for example. Furthermore, the present invention does not restrict the exact well profile or depth, but rather anticipates that a wide range of well profiles and depths may be used beneficially.

By using a shallow P-well for the NMOS device in conjunction with a buried N-type layer below the NMOS P-well, the field-funneling effect is dramatically reduced and the related back injection of charge from the source is eliminated because parasitic bipolar action is eliminated. As a result, the amount of charge collected at the NMOS drain electrode from the electron-hole pairs induced by the ion strike is reduced dramatically, by 90 to 99% or more, depending on the details of the well engineering. Furthermore, the amount of charge collected at the drain electrode due to source-side back-injection of charge to the parasitic bipolar effect is 100% and unconditionally eliminated. Generally, the same reduction of charge collection at the drain also applies to the SB-PMOS device. The net result of these effects is soft errors attributable to drain charge collection from the original charge created by the ion strike or from source-side back-injection of charge are eliminated.

Finally, because metal source/drain MOSFET devices do not suffer from parasitic bipolar action, failure mechanisms due to well charging arising from a particle strike such as single-event latchup and multi-bit upsets are unconditionally eliminated. The parasitic bipolar transistors present in conventional devices do not exist for SB-CMOS, and therefore all reliability problems traceable to parasitic bipolar action are eliminated.

By dramatically reducing charge collection due to the field-funneling effect and eliminating parasitic bipolar action, soft error rate is reduced to zero. This enables simplified manufacturing, IC design and system design. For example, SRAM will be less sensitive to alpha particle radiation originating from radioactive impurities in a chip package, such as solder balls, or from contamination in materials used during the manufacturing process. Or complicated error correction code (ECC) circuitry required in SRAM for single-event and multi-bit upsets can be completely eliminated if the soft error rate is zero. This is a significant saving as 10-20% of the IC layout is typically dedicated to ECC circuitry, which therefore also leads to 10-20% more power, and reduced circuit speed of operation. With the present SB-CMOS invention, no error correction code is generally required, thereby enabling 10-20% chip layout savings, lower power and/or faster SRAM. Similar arguments apply to digital logic applications. For logic, error correction is more difficult than for SRAM. One of the primary techniques used is triple redundancy, where the final output is the state of at least two of the three outputs. This triples the power and area requirements, and slows down chip operation due to the redundancy-checking circuitry. The present invention generally requires no triple redundancy and therefore provides a means to achieve 66% area and power reduction, in systems where triple redundancy is currently required.

These are just a few examples of the benefits of eliminating soft errors. It will be appreciated by one of ordinary skill in the art that the present invention, which eliminates soft errors, provides numerous benefits in manufacturing, IC design and system design, and that many variations exist for combining the present invention in an integrated circuit and in a system, without departing from the spirit and scope of the present invention. It will be further appreciated by one of ordinary skill in the art that the structure could easily be modified to account for different substrate doping types. For example, if an N-type substrate was used in place of a P-type substrate, then a buried P-type layer would be provided below the N-well of the PMOS device. Or alternatively, a buried N-type layer may be provided below the P-type well of the NMOS device and a buried P-type layer may be provided below the N-type well of the PMOS device, irrespective of substrate type.

Figure 3:
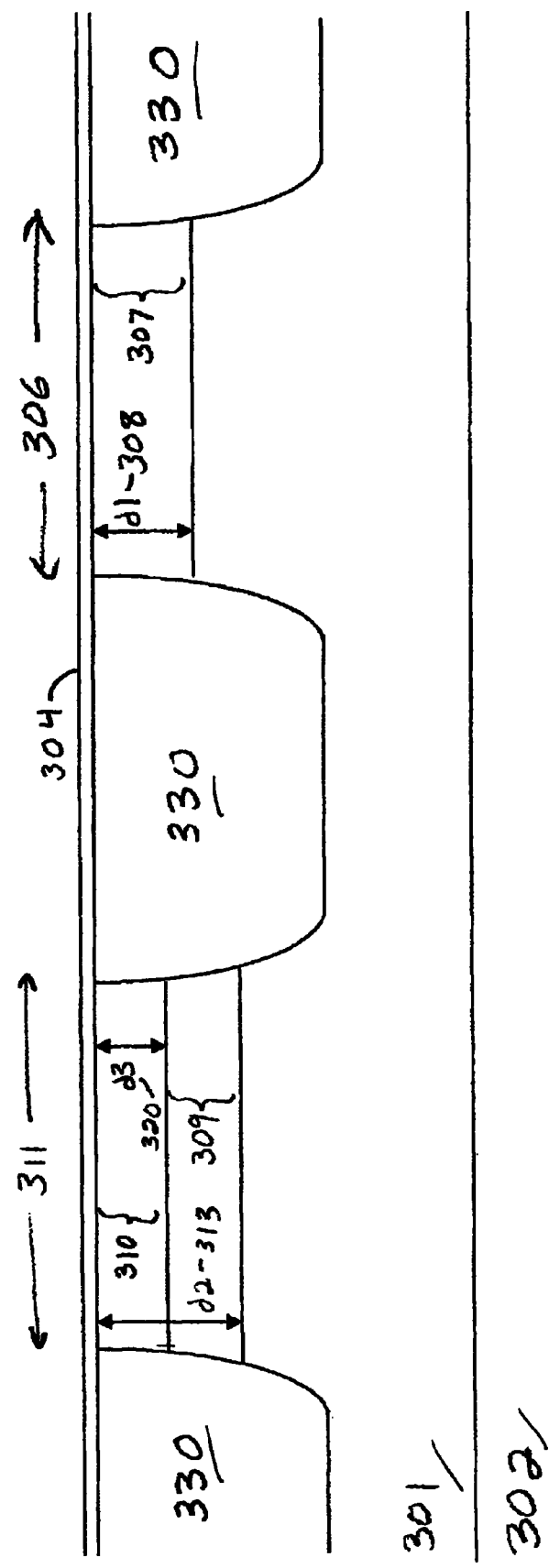
FIG. 3 illustrates an exemplary embodiment of a process of providing a PMOS device N-type well and an NMOS device P-type well and an NMOS device N-type buried well, in accordance with the principles of the present invention.

One exemplary process for the fabrication of a metal source/drain CMOS device is illustrated in FIGS. 3-8. While this process is exemplary of the broad teachings of the present invention, it will be appreciated to one skilled in the art to teach the fundamental concepts of the present invention. This exemplary process flow may be described as follows:

Referencing FIG. 3, starting with a silicon substrate 302, a thin screen oxide 304 is grown (approximately 200 Å) to act as an implant mask. In another embodiment, the silicon substrate 302 is strained. In another embodiment, the substrate is SOI. Following the growth of the screen oxide 304 and the formation of a resist pattern layer such that the active region 306 of the PMOS device is exposed, the dopant Arsenic 307 is ion-implanted through the screen oxide to a predetermined depth in the substrate 302. One or more Arsenic 307 implants may be used to tailor the Arsenic concentration profile in the PMOS active region 306. The Arsenic implants 307 provide the channel doping and well doping for the PMOS device. The resist pattern layer is stripped, and the wafer is patterned again so that an active region 311 of the NMOS device is exposed. The dopant Arsenic 309 is ion-implanted through the screen oxide to a predetermined depth in the silicon. The dopant Boron and/or Indium 310 for the NMOS device active region 311 is then ion-implanted through the screen oxide 304 to a pre-determined depth in the silicon. One or more Arsenic 309 and Boron or Indium 310 implants may be used to tailor well doping and channel doping concentration profile in the NMOS active region 311. The Boron and/or Indium 310 implants provide the channel doping and well doping for the NMOS device, while the buried N-well Arsenic doping 309 provides a means to control the field-funneling effect. Metallurgical junctions form at pre-determined depths d1 308, d2 313 and d3 320. PMOS and NMOS device active regions 306, 311 are isolated by an isolation process, such as STI 330, as shown in process step 300 illustrated in FIG. 3.

Figure 4:
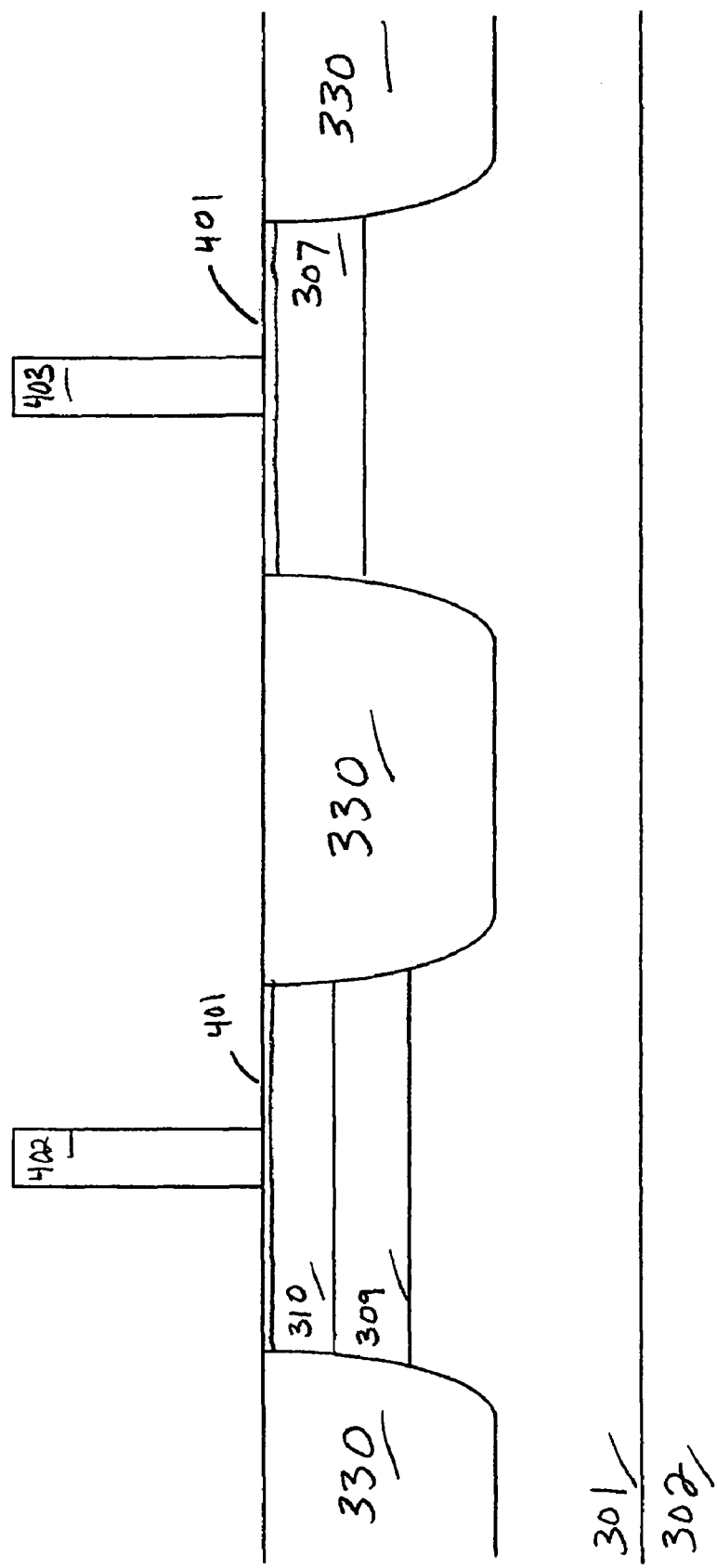
FIG. 4 illustrates an exemplary embodiment of a process of patterning a silicon film on a thin gate insulating layer, in accordance with the principles of the present invention.

Referencing FIG. 4, a thin insulating layer 401 is grown and is comprised of a dielectric material such as silicon dioxide with a thickness of approximately 5 to 50 Å. In another embodiment, a material having a high dielectric constant (high K) is used as the insulating layer 401. Examples of high K materials are provided above. In one embodiment, a polysilicon layer is deposited. Using lithographic techniques, the PMOS active regions are masked, and the exposed polysilicon in the NMOS active regions is heavily doped with an N-type dopant, such as phosphorous by ion implantation. Then, again using lithographic techniques, the NMOS active regions are masked, and the exposed polysilicon in the PMOS active regions is heavily doped with an P-type dopant, such as boron by ion implantation. The substrate is annealed so that the well, channel, and polysilicon implants are electrically activated and redistributed. Using lithographic techniques and a silicon etch that is highly selective to oxide, the N-type 402 and P-type 403 gate electrodes are patterned as shown in the process step 400 illustrated in FIG. 4. In another embodiment, metal gates 402 and 403 are provided.

Figure 5:
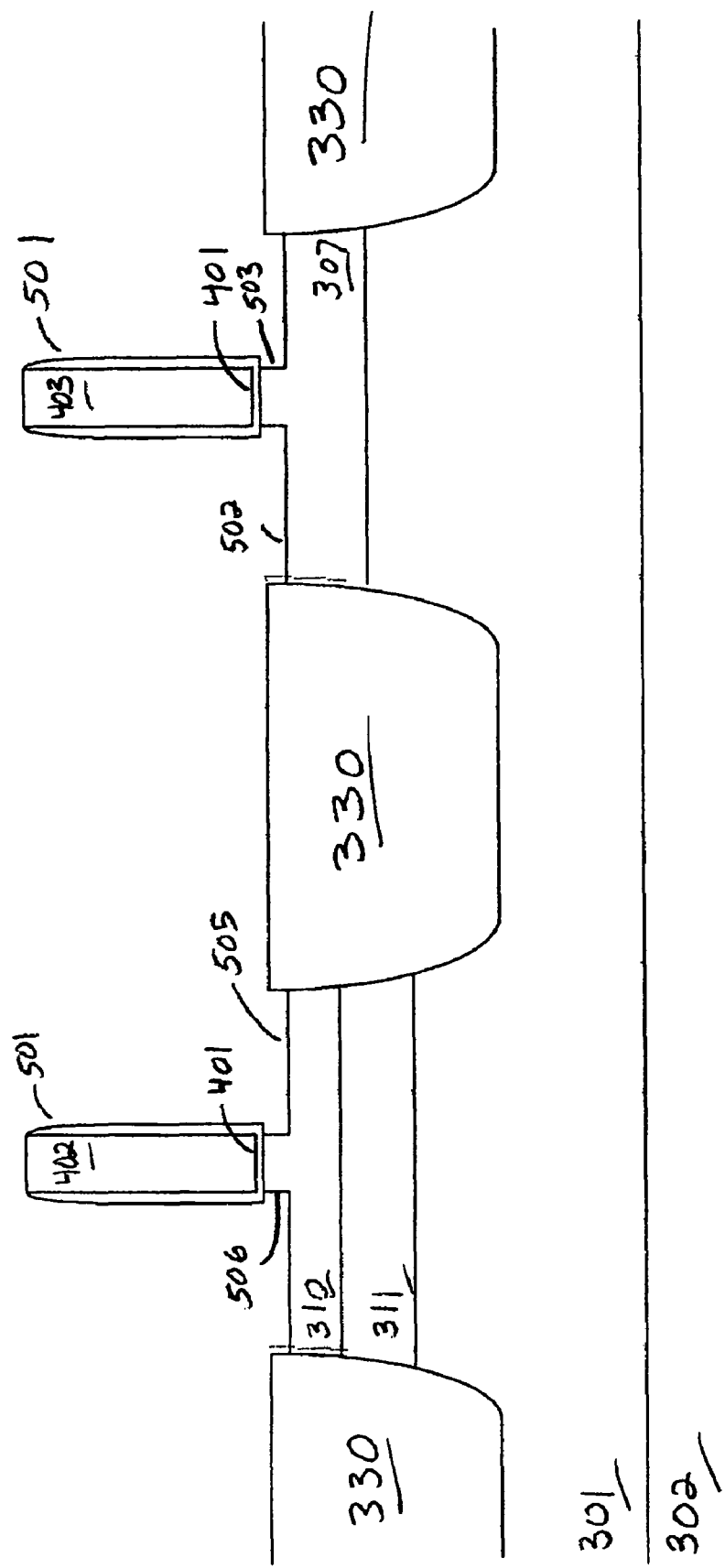
FIG. 5 illustrates an exemplary embodiment of a process of forming thin insulating sidewalls and exposing silicon in gate, source and drain areas, in accordance with the principles of the present invention.

Referencing FIG. 5, a thin oxide (approximately 100 Å) is then thermally grown on the horizontal surface and sidewalls of the silicon gate electrodes. An anisotropic etch is then used to remove the oxide layers on the horizontal surfaces (and thus expose the silicon), while preserving a thin sidewall spacer oxide (also referred to as "spacer insulator") 501 on the vertical surfaces. In this way, the thin sidewall spacer oxide 501 is formed, as shown in the process step 500 illustrated in FIG. 5. In another exemplary embodiment, a thin sidewall spacer insulator 501 may comprise an oxy-nitride layer or a nitride layer. An oxy-nitride layer is a material comprising both oxygen and nitrogen. In another exemplary embodiment, multiple insulating layers of various types may be used to form the spacer insulator 501. In yet another exemplary embodiment, the anisotropic etch etches vertically into the silicon substrate 1 to 10 nm. In one embodiment, at least partially isotropic silicon etch is used to etch vertically into the silicon substrate while also etching laterally below the sidewall spacer insulator 501, thereby exposing the horizontal surfaces 502,505 and vertical surfaces 503,506, as shown in the process step 500 illustrated in FIG. 5.

Figure 6:
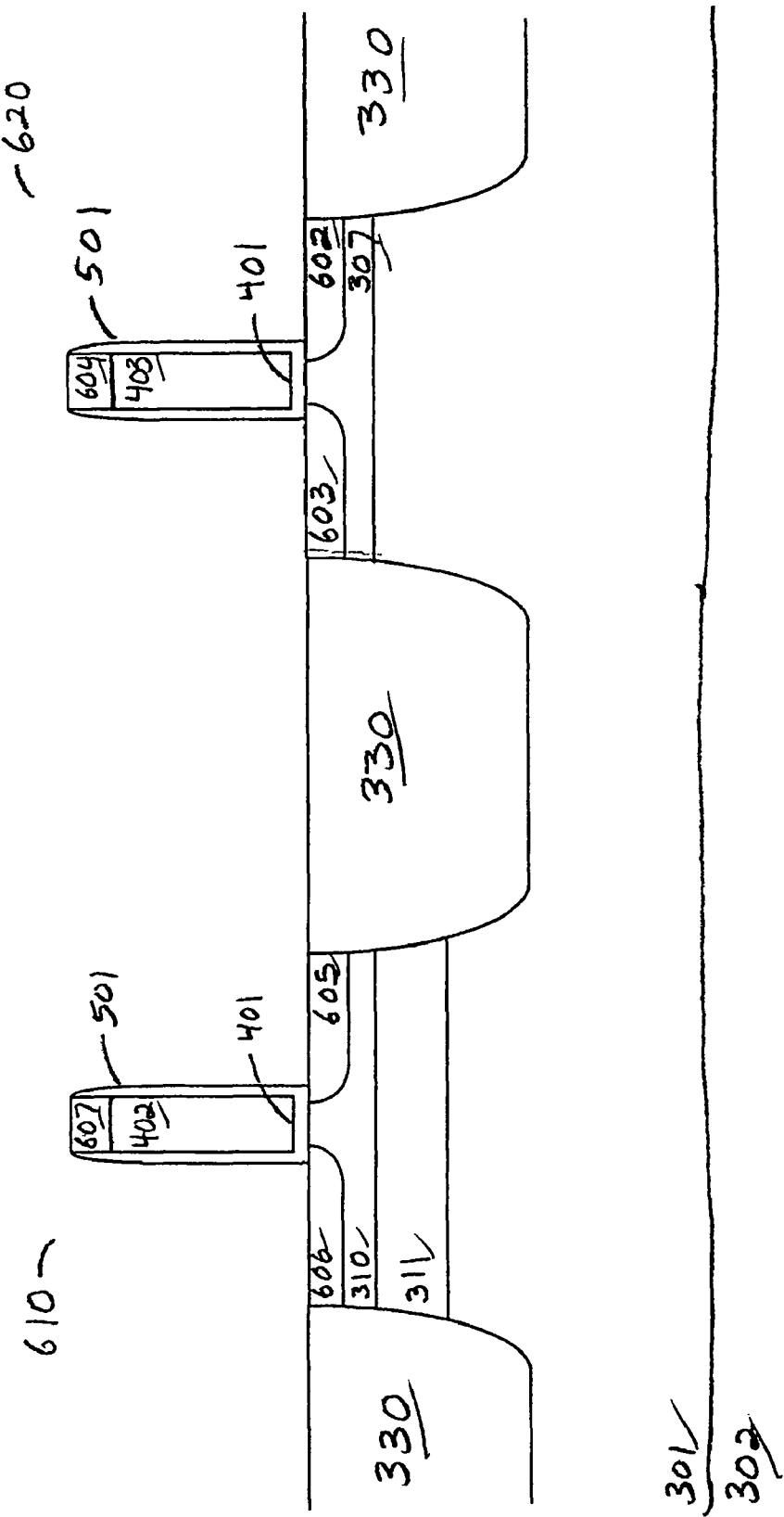
FIG. 6 illustrates an exemplary embodiment of a process of providing a first silicide and a second silicide for the source/drain areas of the PMOS and NMOS devices, respectively, in accordance with the principles of the present invention.

Referencing FIG. 6, the next step encompasses forming the metal silicide source and drain electrodes. In one embodiment, the wafer is patterned using an appropriate masking layer by lithographic techniques such that the PMOS device active regions are exposed. In one exemplary embodiment, a masking layer is a first silicide exclusion mask oxide layer. A first silicide exclusion mask oxide is deposited. Photoresist is deposited next, followed by patterning the photoresist, and etching the first silicide exclusion mask oxide layer.

As shown in FIG. 6, an appropriate metal for an SB-PMOS device silicide (for example Platinum) is deposited, providing a metal layer across the wafer (approximately 50 to 500 Å) and filling the voids formed below the gate 403 and/or the thin sidewall spacer insulator 501 by the isotropic etch. The wafer is then annealed for a specified time at a specified temperature (for example, 400 to 500° C. for 30 to 60 minutes) so that, at all places where the metal is in direct contact with the silicon, a chemical reaction takes place that converts the metal to a metal silicide at a source electrode 602, a metal silicide at a drain electrode 603, and a metal silicide at a gate electrode 604. A wet chemical etch such as aqua regia is then used to remove the unreacted metal while leaving the metal-silicide untouched as shown in the process step 600 as illustrated in FIG. 6.

The wafer is patterned again with an appropriate masking layer by lithographic techniques such that the NMOS active regions 311 are exposed. In one exemplary embodiment, the masking layer is a second silicide exclusion mask oxide layer. A second silicide exclusion mask oxide is deposited. Photoresist is deposited next, followed by patterning the photoresist, and etching the second silicide exclusion mask oxide layer.

As shown in FIG. 6, an appropriate metal for an NMOS device silicide (for example Erbium) is deposited, providing a metal layer across the wafer (approximately 50 to 500 Å) and filling the voids formed below the gate 402 and/or the sidewall spacer insulator 501 by the isotropic etch. The wafer is then annealed for a specified time at a specified temperature (for example, 400-500° C. for 5 to 60 minutes) so that, at all places where the metal is in direct contact with the silicon, a chemical reaction takes place that converts the metal to a metal silicide at a drain electrode 605, a metal silicide at a source electrode 606, and a metal silicide at a gate electrode 607. A wet chemical etch such as sulfuric peroxide is then used to remove the unreacted metal while leaving the metal-silicide untouched as shown in the process step 600 as illustrated in FIG. 6. The processes described with reference to process step 600 as illustrated in FIG. 6 comprise an exemplary embodiment of a dual silicide exclusion mask process for Schottky barrier CMOS.

The dual suicides could be provided by another exemplary embodiment in which only one silicide exclusion mask is used. For example, an appropriate metal for an NMOS device is deposited. Then, a silicide exclusion masking layer is provided using lithographic techniques, thereby exposing the PMOS device active regions. A second metal appropriate for PMOS device is deposited. The wafer is then annealed for a specific time at a specific temperature such that, at all places where the first metal is in direct contact with the silicon, a chemical reaction takes place that converts the metal to a metal silicide at the source electrode 606, a metal silicide at the drain electrode 605, and a metal silicide at the gate electrode 607. Further, during the anneal, the second metal diffuses through the first metal, thereby forming a metal silicide at a source electrode 602, a metal silicide at a drain electrode 603, and a metal silicide at a gate electrode 604. In another exemplary embodiment, the first and second metals at least partially isotropic etches are performed as one etch after the anisotropic etch but prior to the dual silicide exclusion mask process. The Schottky barrier NMOS 610 and PMOS 620 devices are now complete and ready for electrical contacting as shown in the exemplary embodiment illustrated previously in FIG. 2.

The present invention is particularly suitable for use with MOSFET semiconductor devices, but the use of the present teachings is not limited to this particular application. Other semiconductor devices may be applied to the present invention teachings. Thus, the term "MOSFET device" should be interpreted broadly to include any appropriate device for regulating a flow of electrical current having a conducting channel that has two or more points of electrical contact.

Furthermore, while the present invention is particularly suitable for use with semiconductor devices used in CMOS integrated circuits, it may also be applied to other semiconductor devices or other types of integrated circuits. Thus, while this specification describes a device for use with CMOS integrated circuits, this should be interpreted broadly to include any appropriate device for regulating the flow of electrical current having a conducting channel that has two or more points of electrical contact integrated in any circuit.

Although the present invention has been described with reference to preferred embodiments, persons skilled in the art will recognize that changes may be made in form and detail without departing from the spirit and scope of the invention.

We claim:

1. A CMOS device comprising:
a P-type semiconductor substrate, the P-type semiconductor substrate having a top surface and a bottom surface;
a first isolation region, the first isolation region extending a first distance into the P-type semiconductor substrate from the top surface of the P-type semiconductor substrate;
an NMOS active region including:
a buried N-well located on the P-type semiconductor substrate;
a P-well located on the buried N-well; and
at least one Schottky barrier NMOS device located on the P-well;
a PMOS active region including:
an N-well located on the P-type semiconductor substrate; and
at least one Schottky barrier PMOS device located on the N-well;
wherein the buried N-well of the NMOS active region is not electrically contacted via ohmic contacts;
wherein the buried N-well of the NMOS active region forms a metallurgical junction with the P-type semiconductor substrate, the metallurgical junction located a second distance into the P-type semiconductor substrate from the surface of the P-type substrate, wherein the second distance is less than the first distance; and
wherein the NMOS active region and the PMOS active region are electrically insulated from one another by the first isolation region.

2. The device of claim 1, wherein the P-well forms a metallurgical junction with the buried N-well, wherein the metallurgical junction between the P-well and the N-well is located about 50 nm to about 1000 nm distant from a source and a drain of the at least one Schottky barrier NMOS device.

3. The device of claim 1, wherein the N-well forms a metallurgical junction with the P-type semiconductor substrate, wherein the metallurgical junction between the N-well and the P-type semiconductor is located about 50 nm to about 1000 nm distant from a source and a drain of the at least one Schottky barrier NMOS device.

4. The device of claim 1, wherein the at least one Schottky barrier NMOS further includes:
a gate located on a major surface of the P-well, the major surface located opposite a junction formed between the P-well and the buried N-well; and
a source electrode and a drain electrode configured to electrically contact an N-channel region and the P-well, wherein the N-channel region is formed at an interface between the gate and the P-well when an appropriate voltage is applied to the gate and further wherein the source electrode and the drain electrode each form a Schottky barrier with the N-channel region and the P-well.

5. The device of claim 4, wherein the gate includes:
a gate insulator located on the top surface of the P-well;
a gate electrode located on the gate insulator, the gate electrode having a horizontal surface that is parallel to the top surface of the P-well and a vertical surface that is perpendicular to the top surface of the P-well; and
a gate sidewall insulator located on the vertical surface of the gate electrode.

6. The device of claim 5, wherein the gate insulator includes a high k dielectric material.

7. The device of claim 4, wherein the source electrode and the drain electrode each include a metal silicide.

8. The device of claim 7, wherein the metal silicide includes a member of the group consisting of: Platinum Silicide, Palladium Silicide, and Iridium Silicide.

9. The device of claim 4, wherein the N-channel region is strained.

10. The device of claim 1, wherein the at least one Schottky barrier PMOS further includes:
a gate located on a major surface of the N-well, the major surface located opposite a junction formed between the N-well and the P-type semiconductor substrate; and
a source electrode and a drain electrode configured to electrically contact a P-channel region and the N-well, wherein the P-channel region is formed at an interface between the gate and the N-well when an appropriate voltage is applied to the gate and further wherein the source electrode and the drain electrode each form a Schottky barrier with the P-channel region and the N-well.

11. The device of claim 10, wherein the gate includes:
a gate insulator located on the top surface of the N-well;
a gate electrode located on the gate insulator, the gate electrode having a horizontal surface that is parallel to the top surface of the N-well and a vertical surface that is perpendicular to the top surface of the N-well; and
a gate sidewall insulator located on the vertical surface of the gate electrode.

12. The device of claim 11, wherein the gate insulator includes a high k dielectric material.

13. The device of claim 10, wherein the source electrode and the drain electrode each include a metal silicide.

14. The device of claim 13, wherein the metal silicide includes a rare-earth silicide.

15. The device of claim 10, wherein the P-channel region is strained.

16. The device of claim 1, wherein the P-well of the at least one Schottky barrier NMOS device is not electrically contacted via ohmic contacts.

17. The device of claim 1, wherein the N-well of the at least one Schottky barrier PMOS device is not electrically contacted via ohmic contacts.

18. A CMOS device comprising:
an N-type semiconductor substrate, the N-type semiconductor substrate having a top surface and a bottom surface;
a first isolation region, the first isolation region extending a first distance into the N-type semiconductor substrate from the top surface of the N-type semiconductor substrate;
an NMOS active region including:
a P-well located on the N-type semiconductor substrate; and at least one Schottky barrier NMOS device located on the P-well;

a PMOS active region including:
- a buried P-well located on the N-type semiconductor substrate;
- an N-well located on the buried P-well; and
- at least one Schottky barrier PMOS device located on the N-well;

wherein the buried P-well of the PMOS active region is not electrically contacted via ohmic contacts;

wherein the buried P-well of the PMOS active region forms a metallurgical junction with the N-type semiconductor substrate, the metallurgical junction located a second distance into the N-type semiconductor substrate from the surface of the N-type substrate, wherein the second distance is less than the first distance; and wherein the NMOS active region and the PMOS active region are electrically insulated from one another by the first isolation region.

19. The device of claim 18, wherein the N-well forms a metallurgical junction with the buried P-well, wherein the metallurgical junction between the N-well and the P-well is located about 50 nm to about 1000 nm distant from a source and a drain of the at least one Schottky barrier PMOS device.

20. A CMOS device comprising:

a P-type semiconductor substrate, the P-type semiconductor substrate having a top surface and a bottom surface;

an NMOS active region including:
- a buried N-well located on the P-type semiconductor substrate;
- a P-well located on the buried N-well; and
- at least one Schottky barrier NMOS device located on the P-well;

a PMOS active region including:
- an N-well located on the P-type semiconductor substrate; and
- at least one Schottky barrier PMOS device located on the N-well;

a first isolation region, wherein the first isolation region is located between the NMOS active region and the PMOS active region, wherein the first isolation region extends a first distance into the P-type semiconductor substrate from the top surface of the P-type semiconductor substrate, wherein the buried N-well of the NMOS active region forms a metallurgical junction with the P-type semiconductor substrate, wherein the metallurgical junction is located a second distance into the P-type semiconductor substrate from the surface of the P-type substrate, and wherein the second distance is less than the first distance.

* * * * *